United States Patent
Izzo et al.

(10) Patent No.: US 12,186,943 B2
(45) Date of Patent: Jan. 7, 2025

(54) CONTROLLED PRINTING SURFACE AND METHOD OF FORMING TOPOGRAPHICAL FEATURES ON A CONTROLLED PRINTING SURFACE

(71) Applicant: Henkel AG & Co. KGaA, Duesseldorf (DE)

(72) Inventors: Michael M. Izzo, South Windsor, CT (US); Ivan Gustaf Johnson, Wallingford, CT (US)

(73) Assignee: Henkel AG & Co. KGaA, Duesseldorf (DE)

( * ) Notice: Subject to any disclaimer, the term of this patent is extended or adjusted under 35 U.S.C. 154(b) by 293 days.

(21) Appl. No.: 17/387,791

(22) Filed: Jul. 28, 2021

(65) Prior Publication Data
US 2022/0016809 A1   Jan. 20, 2022

Related U.S. Application Data

(63) Continuation of application No. PCT/US2020/015325, filed on Jan. 28, 2020.
(Continued)

(51) Int. Cl.
*B29C 35/00* (2006.01)
*B05D 1/32* (2006.01)
(Continued)

(52) U.S. Cl.
CPC ............ *B29C 35/002* (2013.01); *B05D 1/32* (2013.01); *B05D 3/067* (2013.01);
(Continued)

(58) Field of Classification Search
CPC . B29C 35/002; B29C 35/0266; B29C 59/002; B29C 67/004; B29C 2791/005; B05D 1/32; B05D 3/067
See application file for complete search history.

(56) References Cited

U.S. PATENT DOCUMENTS 4,258,123 A   3/1981   Nagashima et al.
4,505,793 A   3/1985   Tamoto et al.
(Continued)

FOREIGN PATENT DOCUMENTS

DE   3728337 A1   3/1989
DE   3740149 A1   6/1989
(Continued)

OTHER PUBLICATIONS

International Search Report issued in connection with International Patent Application No. PCT/US2020/015325 issued on May 29, 2020.

*Primary Examiner* — David H Banh
(74) *Attorney, Agent, or Firm* — Steven C. Bauman

(57) ABSTRACT

Provided herein are methods of forming and optimizing cured features on a surface including controlling the surface upon which the cured features are applied. Additionally, a system for forming and processing the topographical features on the membrane is also described, along with mechanical features at specific system stations. More particularly, provided herein are methods of forming and optimizing topographical features applied to a membrane surface by controlling the membrane surface and by controlling the direction and magnitude of pressure applied to the membrane (substrate), as well as initially partially curing the topographical features, followed by fully curing of the topographical features to form the membrane having topographical spacing features formed thereon.

19 Claims, 5 Drawing Sheets

Related U.S. Application Data

(60) Provisional application No. 62/798,198, filed on Jan. 29, 2019.

(51) Int. Cl.
  *B05D 3/06* (2006.01)
  *B29C 35/02* (2006.01)
  *B29C 59/00* (2006.01)
  *B29C 67/00* (2017.01)

(52) U.S. Cl.
  CPC ........ *B29C 35/0266* (2013.01); *B29C 59/002* (2013.01); *B29C 67/004* (2013.01); *B29C 2791/005* (2013.01)

(56) References Cited

U.S. PATENT DOCUMENTS

| | | |
|---|---|---|
| 5,132,248 A | 7/1992 | Drummond et al. |
| 5,384,685 A | 1/1995 | Tong et al. |
| 5,395,862 A | 3/1995 | Neckers et al. |
| 5,451,343 A | 9/1995 | Neckers et al. |
| 5,545,676 A | 8/1996 | Palazzotto et al. |
| 5,607,566 A | 3/1997 | Brown et al. |
| 5,637,426 A | 6/1997 | Uchikawa |
| 6,720,395 B2 | 4/2004 | Nakagawa |
| 7,781,494 B2 | 8/2010 | Okada et al. |
| 2003/0070569 A1 | 4/2003 | Bulthaup et al. |
| 2005/0104946 A1 | 5/2005 | Siegel |
| 2005/0269749 A1* | 12/2005 | Itoh ............... C04B 35/581 264/618 |
| 2009/0197054 A1 | 8/2009 | Chauhan et al. |
| 2010/0118642 A1 | 5/2010 | Ho et al. |
| 2011/0076448 A1 | 3/2011 | Agarwal et al. |
| 2012/0062665 A1 | 3/2012 | Roof et al. |
| 2014/0243444 A1 | 8/2014 | Ikari et al. |
| 2014/0305863 A1 | 10/2014 | Van Engelen |
| 2017/0007965 A1 | 1/2017 | Van Berchum et al. |
| 2018/0020546 A1* | 1/2018 | Pepin ............... H05K 3/323 |
| 2020/0310211 A1* | 10/2020 | DeNolf ............ G02F 1/15165 |

FOREIGN PATENT DOCUMENTS

| | | |
|---|---|---|
| EP | 0369645 | 5/1990 |
| EP | 0563925 | 10/1993 |
| GB | 2350321 A | 11/2000 |
| WO | 9523244 A1 | 8/1995 |
| WO | 9919900 A2 | 4/1999 |

\* cited by examiner

CONTROLLED PRINTING SURFACE AND METHOD OF FORMING TOPOGRAPHICAL FEATURES ON A CONTROLLED PRINTING SURFACE

BACKGROUND

1. Field

The present invention relates to methods of forming and optimizing cured features on a surface including controlling the surface upon which the cured features are applied. More particularly, the present invention relates to methods of forming and optimizing topographical features applied to a membrane surface by controlling the membrane surface by controlling the direction and magnitude of pressure applied to the membrane.

2. Brief Description of Related Technology

Formation of spacer features on filtration devices and reverse osmosis membranes used in such devices is known. The use of patterns of curable composition printed onto membrane surfaces serve as replacements for more conventional mesh layers which allow a liquid, such as water, to flow and also to keep the filtration membranes apart by providing a spacing function. The formation of such patterns on a membrane are believed to have advantages over mesh layers, particularly because the patterns provide less obstruction of flow and less build-up of filter debris (commonly referred to as fouling). Moreover, spacers placed directly on the surface of the membrane may have a height reduced by 50% when compared to a convention mesh spacer. A smaller spacer height in a traditional mesh would not be possible as it would dramatically increase feed pressure as well as pressure drop across the element. The smaller height of the printed spacers does not appear to reduce feed pressure significantly. The open design of the printed spacer features produces a similar pressure drop at the smaller height than mesh spacers, which have a closed or fenestrated design. The benefit of the smaller printed spacer height is that it allows for more membrane to be rolled into the element to produce the same specified diameter as the traditional mesh at a greater spacer height. For example, in certain instances, the printed spacers allow for 7 additional leaves (i.e., sheets of membrane) to be utilized, for a total of 35 leaves rather than the traditional 28 leaves in the same 8 inch diameter element (i.e., 25% more). In other cases, 3 more leaves may be added, for a total of 10 leaves rather than the typical 7 leaves in a 4 inch diameter element (i.e., 40% more).

There are many difficulties in commercial manufacturing of membranes having printed curable composition patterns, i.e. referred to herein as topographical features. The topographical feature must have a size and shape which provides sufficient spacing from the adjacent layer, balanced with a minimum coverage of the surface area of the membrane to allow a maximum of fluid flow.

In printing onto the membrane surface direct contact between a stencil and the membrane surface is a concern. Such membranes are delicate and easily damaged during physical contact with the stencil and other portions of the printing apparatus. Flat, even, and sufficient contact between the stencil and the membrane surface is necessary to contain the curable composition within stencil openings and optimize bleeding of the curable composition between the stencil and membrane surface. However, contact between the stencil and membrane surface that is too forceful or uneven will often damage the membrane.

In addition, the membrane can be damaged during the numerous steps of the printing process that require handling or moving the membrane. For example, the membrane must be moved onto and off of a printing surface and dragging the membrane over the printing surface can tear the membrane. To allow for accurate printing the membrane must be flat on the printing surface. Ensuring that the membrane is substantially flat requires further manipulation of the membrane; again allowing for potential damage. Further, the acts of bringing the stencil into contact with the membrane surface and removing the stencil from the membrane surface also present opportunities for the membrane to be damaged.

Moreover, many curable compositions cannot meet the chemical and temperature resistance requirements to withstand the aggressive environments introduced by the cleaning cycles used in these applications. In addition, the curable composition is required to have high bond strengths to the membrane while also not being too brittle to damage the membrane during rolling or too soft and flexible that will compress and lose the specified spacing required while under pressure in use.

There is a need for a method of printing a curable composition that allows for printing of topographical features on surfaces, such as membranes, that optimizes the topographical features while minimizing the damage to the surface (e.g., the membrane) caused by contact with the stencil and other print apparatus parts.

SUMMARY

The present invention provides a means of satisfying the above-mentioned needs. The present invention provides a method of forming and optimizing cured features on a surface including controlling the surface upon which the cured features are applied. More specifically, the present invention relates to methods of forming and optimizing topographical features applied to a membrane surface by controlling the membrane surface by controlling the direction and magnitude of pressure applied to the membrane.

In an aspect of the invention, there is provided a method of forming topographical features on a membrane surface including the steps of: providing a stencil over a first surface of a membrane, the stencil having openings exposing the first surface for receiving a curable composition; applying positive pressure to a second opposing surface of the membrane to contact the first surface to the stencil; depositing one or more layers of curable composition into the stencil openings and onto the first surface to form topographical features, the openings defining an approximate shape and size of the topographical features; exposing the curable composition to conditions to partially cure the curable composition to a state sufficient to hold its topographical features but insufficient to cause adhesion to the stencil; and applying negative pressure to the second surface to separate the membrane and stencil without disturbing the partially cured topographical features; wherein the positive pressure is sufficient to reduce a halo area around the topographical features by at least 10%.

In one aspect of the present invention, there is provided a method of forming topographical features on a membrane surface including the steps of: providing an apparatus with a support for supporting a membrane having a first surface and a second opposing surface and capable of producing a positive pressure and a negative pressure on the surface of the membrane in contact with the support; placing the second surface of the membrane in contact with the support; providing a stencil over the first surface of the membrane, the stencil having openings exposing the first surface for receiving a curable composition; applying positive pressure to the second surface to contact the first surface to the stencil; depositing one or more layers of curable composition into the stencil openings and onto the first surface to form topographical features, the openings defining an approximate shape and size of the topographical features; exposing the curable composition to conditions to partially cure the curable composition to a state sufficient to hold its topographical features but insufficient to cause adhesion to the stencil; and applying negative pressure to the second surface to separate the membrane and stencil without disturbing the partially cured topographical features; wherein the positive pressure is sufficient to reduce a halo area around the topographical features by at least 10%.

In another aspect of the invention, there is provided a system for forming a pattern of features on a surface of a substrate, the system including:

A. a pre-cure station, including:
  i. a first support for supporting a substrate with two opposing surfaces;
  ii. a deposition device that deposits a pattern of a curable composition on at least one surface of the substrate; and
  iii. a partial cure device that partially cures the pattern of the curable composition to form a partially cured pattern of the curable composition on the at least one surface of the substrate;
B. a first transport device that transports the substrate from the pre-cure station to a full-cure station; and
C. the full-cure station, including:
  i. a second support for supporting the substrate with the partially cured pattern of the curable composition on the at least one surface of the substrate;
  ii. a full cure device that fully cures the partially cured pattern of the curable composition to form the pattern of features on the at least one surface of the substrate.

Additionally, the system may further include:

D. a second transport device that transports the substrate (membrane) from the full-cure station to a substrate sizing station; and
E. a third transport device that transports the substrate (membrane) sheets to a substrate receiving station, which receives and stores the substrate sheets.

Additionally, the system may include a membrane dispensing device that dispenses a predetermined size of the substrate (membrane) and further may include a cutting device that cuts the substrate at the predetermined size to form substrate sheets (not shown).

BRIEF DESCRIPTION OF THE FIGURES

FIG. 2 shows a stencil and membrane arrangement, showing openings for deposition of a curable composition, on a membrane surface, in the form of topographical features (showing 3-D) having a desired size and shape, the topographical features being sufficient to perform a spacing function when layered with other membrane surfaces. The aspect ratio (which provides for a desired spacing capability) of the features is shown.

FIG. 3 shows photographs of topographical features printed on a membrane and the halos around the topographical features.

DETAILED DESCRIPTION

Figure 1:
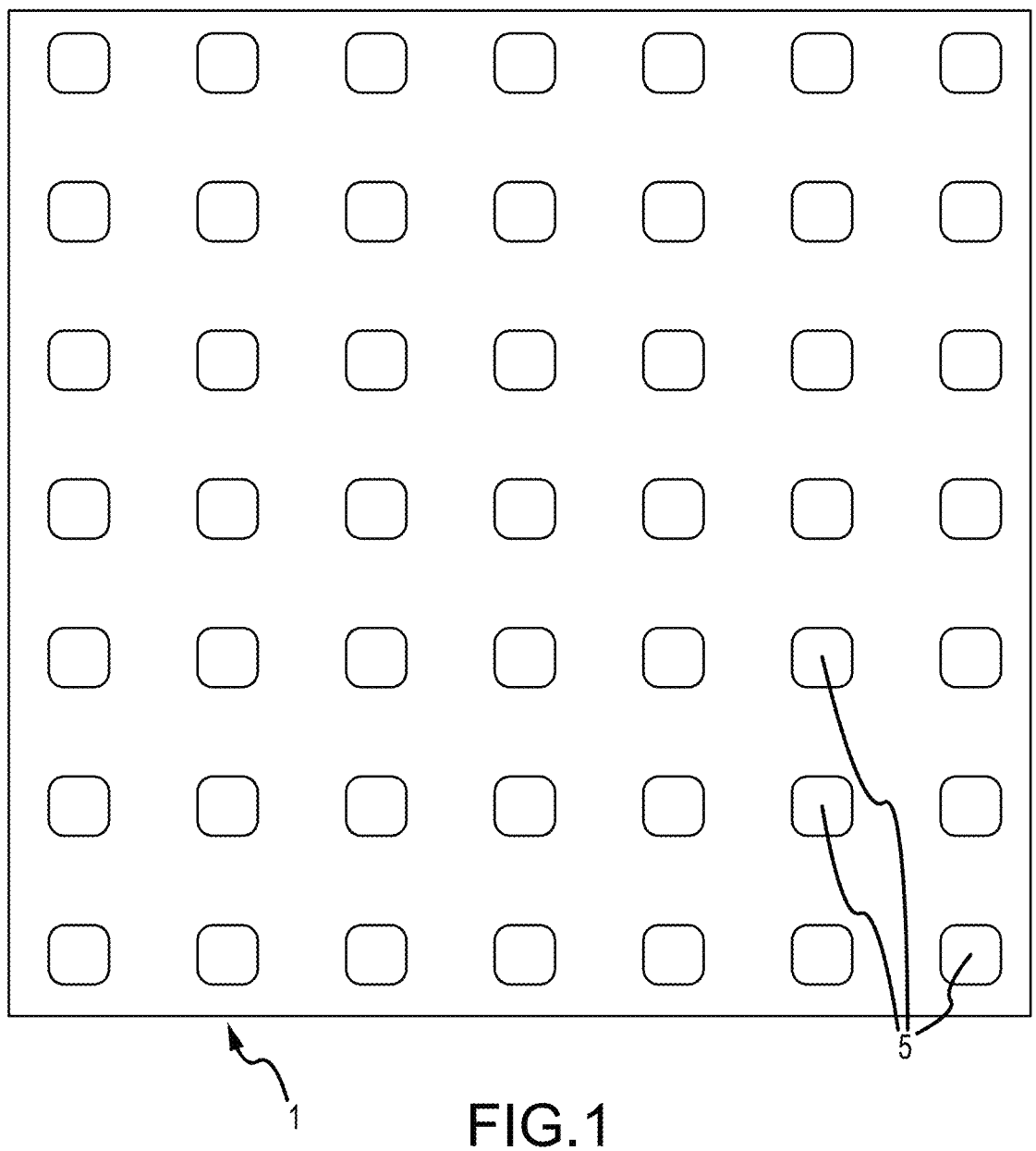
FIG. 1 depicts a typical pattern of topographical features (5) on a membrane (1) for desalination of water or filtration of brackish water.

The present invention is directed to methods of forming and optimizing cured features on a surface by controlling the surface upon which the cured features are applied. More specifically, the present invention relates to methods of forming and optimizing topographical features applied to a membrane surface by controlling the membrane surface by controlling the direction and magnitude of pressure applied to the membrane.

A method of forming topographical features on a membrane surface according to the present invention includes the steps of: providing a stencil over a first surface of a membrane, the stencil having openings exposing the first surface for receiving a curable composition; applying positive pressure to a second opposing surface of the membrane to contact the first surface to the stencil; depositing one or more layers of curable composition into the stencil openings and onto the first surface to form topographical features, the openings defining an approximate shape and size of the topographical features; exposing the curable composition to conditions to partially cure the curable composition to a state sufficient to hold its topographical features but insufficient to cause adhesion to the stencil; and applying negative pressure to the second surface to separate the membrane and stencil without disturbing the partially cured topographical features; wherein the positive pressure is sufficient to reduce a halo area around the topographical features by at least 10%.

As used herein, the term "halo" means the portion of the curable composition on the membrane surface that extends beyond the area of the base of a topographical feature defined by the opening in the stencil. As used herein, the term "halo area" means the relative area of the halo as compared to the area of the topographical feature on the membrane surface defined by the opening in the stencil (i.e., the footprint of the topographical feature). Halo area ($A_h$) is calculated using the following formula:

$$A_h = (A_c - A_{tf})/A_{tf}$$

wherein $A_{tf}$ is the area of the membrane surface covered by the topographical feature as defined by the opening in the stencil and $A_c$ is the combined area on the membrane surface covered by the topographical feature (as defined by the opening in the stencil) and covered by the halo. When the $A_c$ equals $A_{tf}$, there is no halo.

Thus, the percent reduction in the halo area produced by the inventive process may be represented as:

$$\% \text{ reduction } A_h = ((A_{h(ni)} - A_{h(i)})/A_{h(ni)}) \times 100\%$$

wherein $A_{h(ni)}$ is the halo area resulting from a typical non-inventive process and $A_{h(i)}$ is the halo area resulting from the inventive process; each using the same size and shape of topographical feature.

In an aspect of the present invention, the pattern of topographical features may have a size and shape sufficient to maintain adequate membrane spacing and to expose sufficient membrane surface to ensure efficient operation of the membrane. In particular, the total surface area of the membrane covered by the topographical features (i.e., $A_c$, defined as the combined area on the membrane surface covered by the topographical feature (as defined by the opening in the stencil) and covered by the halo) multiplied by the number of topographical features per unit area of the membrane surface) is not more than about 20% of the surface of the membrane (i.e., at least about 80% of the membrane surface remains exposed). In an aspect of the present invention, the total surface area of the membrane covered by the topographical features is not more than about 15%, or not more than about 10%, or not more than about 6%, or not more than about 5%, or not more than about 3%, or note more than about 2%, or not more than about 1%.

In aspects of the present invention, the size of the halo area may be optimized to provide adequate curable composition contact with the surface to maintain adhesion through production and use while leaving a sufficient area of the surface uncovered to allow for adequate membrane function. In another aspect of the present invention, the method of the present invention produces a percentage reduction of the halo area of at least about 10%, at least about 20%, at least about 30%, at least about 40%, at least about 50%, at least about 60%, at least about 70%, at least about 80%, at least about 90%, or about 100%. In an aspect of the present invention, the method of the present invention produces a percentage reduction of the halo area of between about 5% and about 95%, between about 15% and about 85%; between about 25% and about 75%; between about 35% and about 65%; and between about 45% and about 55%.

The methods of the present invention may be carried out using high speed production printing methods known in the art. Preferably, the methods of the invention employ direct printing via stencil/screen or gravure printing methods.

Figure 2A:
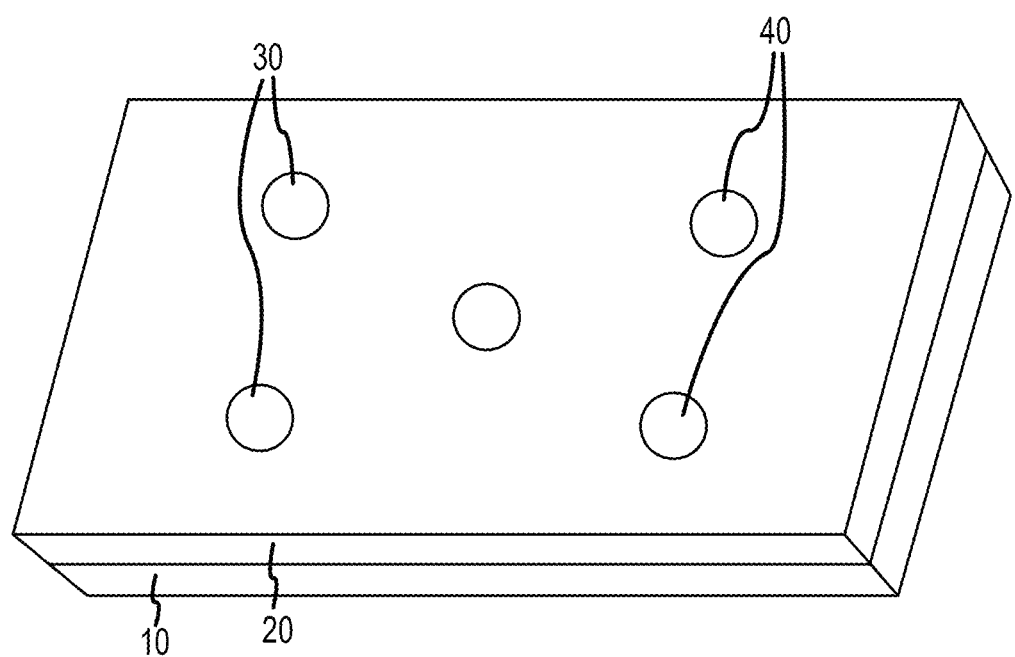
FIG. 2a shows the stencil overlaid on the membrane surface and FIG. 2b shows the stencil and membrane after the stencil has been removed leaving the topographical features.
Figure 2B:
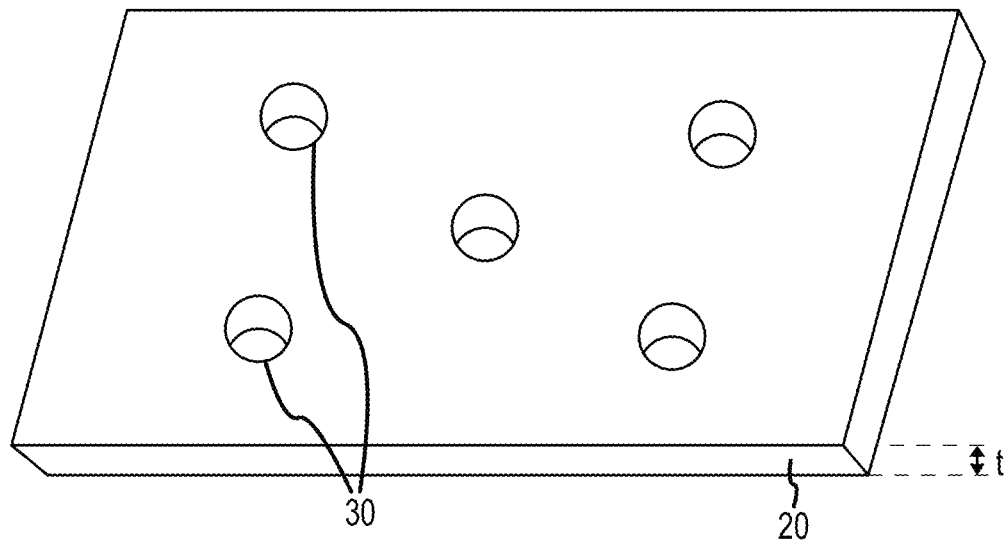
Figure 2B:
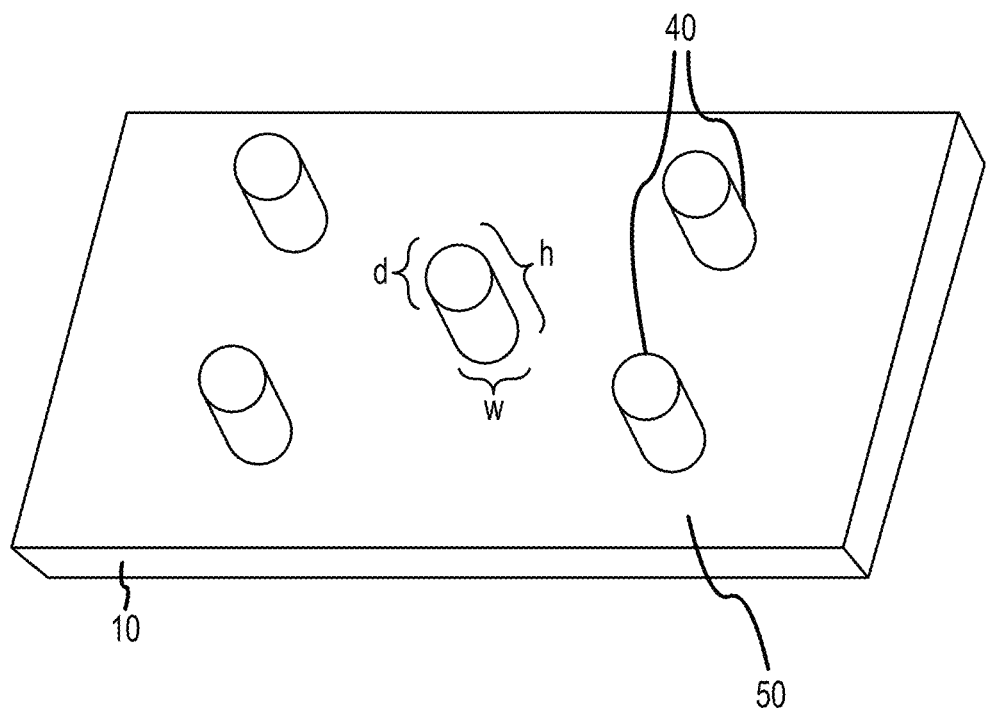

As shown in FIG. 2a, the membrane (10) is overlaid with the stencil (20) on one of the membrane's surfaces (not shown). The openings (30) in the stencil are filled with curable composition to form the topographical features (40). As shown in FIG. 2b, when the stencil (20) is removed from the membrane (10) the topographical features (40) formed from the curable composition are left attached to the membrane surface (50).

The surface upon which the topographical features are by the methods of the present invention may include any surface suitable for the highspeed printing methods disclosed herein. In an aspect of the present invention, the surface upon which the topographical features are formed is a membrane surface, also referred to as a substrate surface. As used herein, a "membrane" means a selective barrier that allows passage of some substances but prevents passage of other substances. In an aspect of the present invention, the membrane is a filter membrane, i.e., a membrane for filtering substances out of a liquid carrier, such as water. Filter membranes include reverse osmosis membranes, forward osmosis membranes, microfiltration membranes, ultrafiltration membranes, and nanofiltration membranes. The topographical features may be printed on the active surface of the membrane, or on the non-active surface of the membrane, or both. The devices made in accordance with the present invention may also be used in applications where energy is produced, such as by reverse electrodialysis or pressure retarded osmosis (e.g., salinity gradient power generation or osmotic power generation).

In an aspect of the invention, the membrane has a first surface and a second opposing surface. In an aspect of the present invention, the curable composition is deposited into the stencil or screen openings and onto the first membrane surface to form the topographical features by depositing a single layer of the curable composition. In another aspect of the present invention, the curable composition is deposited into the stencil or screen openings and onto the first membrane surface to form the topographical features by depositing multiple layers of the curable composition. In aspects of the present invention, the topographical features may be deposited on the first surface (either the feed side or permeate side) or on both the first surface and the opposing second surface.

In aspects of the present invention, the curable composition bleeds onto a portion of the surface covered by the stencil. When the portion of the curable composition that has bled is cured it forms a halo around the topographical feature (as discussed above). Thus, the halo area is a function of the properties of the curable composition (e.g., how easily it flows, etc.), the composition of the membrane and the stencil, and the nature of the contact between the membrane surface and the stencil (e.g., are the membrane and stencil both flat and in even contact with one another and how much pressure is applied to contact the membrane surface and the stencil).

As used herein, the term "positive pressure" means pressure applied against surface that has a direction away from the source of the pressure. Thus, a positive pressure can be thought of as pushing against the surface upon which it is applied. As used herein, the term "negative pressure" means pressure applied against surface that has a direction toward the source of the pressure. Thus, a negative pressure can be thought of as pulling on the surface upon which it is applied, such as suction or a vacuum.

In an aspect of the present invention, after the stencil is placed over the first membrane surface, positive pressure is applied to the second opposing surface of the membrane to force the first surface into contact stencil. This positive pressure thereby creates a stronger contact between the first surface and the stencil during the deposition of the curable composition into the stencil openings thereby reducing the bleeding of the curable composition. However, the positive pressure must not be so high that it leads to damage to the membrane. In aspects of the present invention, positive pressure has a magnitude between about 5 psi and about 50 psi, between about 10 psi and about 40 psi, or between about 20 psi and 30 psi.

The stencil or screen may be constructed from any useful material that allows for adequate sealing of the stencil to the surface to aid in optimizing bleeding of the curable composition onto the portion of the surface covered by the stencil and also allow for removal of the stencil from the surface without damaging the surface or disturbing the deposited curable composition. In aspects of the present invention, the stencil or screen is made from a metal, such as steel, aluminum, stainless steel, polymeric coated metal, a ceramic coated metal, metal fabric, composite materials, a polymer, such as polyester or fluoropolymers, or a polymer fabric.

A stencil printing method uses a stencil made from a single sheet of material in which a pattern is cut. The stencil is mounted into a frame and may also be mounted to a frame with a mesh to provide tightness, flatness and spring. The mesh may be constructed of any suitable material, for example stainless-steel, nylon, plastic, carbon fiber, or the like. The thickness of the stencil will be the height of the feature being printed, minus the effects of gravity and physics that reduce the height by a certain factor during printing (typically about 20%). The pattern and openings size (apertures) also determine how much product can be released out of a maximum thickness stencil. A stencil with a superior surface with low surface energy will provide higher release from the stencil. The wet printing method is limited to a height about 20% lower than the stencil thickness. Moreover, in the wet printing method, the stencil thickness is limited to about 0.010 inches. For stencil thicknesses above about 0.010 inches the curable composition does not release from the stencil. However, in the pre-cure method, using the stencil as a mold, the product pre-cures to the thickness of the stencil and the stencil may have a higher thickness than used in the wet printing method. For example, in the pre-cure method, the stencil may have a thickness as high as 0.050 inches. Thus, the features can be released from the apertures of the stencil because the curable composition is not fully cured and due to the low surface energy coating of the stencil. After the curable composition is fully cured, the height of the features is approximately the same as the height of the stencil.

A screen printing method uses a stainless-steel mesh or a polyester or Nylon screen, which has an emulsion applied thereon to cover portions of the screen or mesh and expose a pattern into which the curable composition is deposited. Print thickness is dependent on the mesh thickness, mesh open area, and emulsion build-up thickness. Thickness is also affected by printer variables such as squeegee pressure and durometer, angle of attack, speed, and snap-off distance. The viscosity of printing materials may vary from low to high depending on the application needs.

The openings or apertures in the stencil or screen pattern of the present invention may take any shape or combination of shapes required to produce a desired shape for the topographical features. For example, the openings may be shaped as circles, ovals, arcs, squares, rectangles, diamonds, pentagons, hexagons, stars, chevrons, or any combination thereof. Such opening shapes will produce 3 dimensional topographical features having a cross-section corresponding to the shape(s) of the openings and having the height and aspect ratio described herein. For example, a circular opening will produce a cylindrical topographical feature, such as a topographical feature pattern for desalination of water or filtration of brackish water shown in FIG. 1. The depth of the stencil will determine the height of the topographical feature and is chosen for the desired height in accordance with the aspect ratios desired. For example, the heights may be from about 0.005 to about 0.04 inches and desirably about 0.010 to about 0.025 inches, more preferably from about 0.012 to about 0.015 inches.

In an aspect of the present invention, the topographical features are substantially free of sharp edges after formation and removal of the stencil. For example, the edges of the openings of the stencil may be free of any sharp edges so that the deposited curable composition does not have sharp edges. Moreover, when the stencil or screen is removed the curable composition does not pull up with the stencil or screen causing sharp edges on the topographical feature. Essentially, the curable composition slumps enough to maintain a rounded or flat surface, but the curable composition does not slump enough to lose the aspect ratio. In addition, the stencil coating is chosen to have low enough surface energy to avoid pulling the curable composition when the stencil or screen is removed. Thus, the topographical features are typically smooth or flat, with no sharp edges that may damage the mating layer of membrane during operation.

Generally, the curable composition of the present invention is capable of being deposited into the stencil openings and onto the membrane surface, and once deposited and allowed to become static, capable of maintaining its shape during removal of the stencil and during curing. In aspects of the present invention, the curable composition has a cure speed of about 5 seconds or less. In aspects of the present invention, the curable composition has a cure speed of about 4 seconds or less, about 3 seconds or less, about 2 seconds or less, about 1 seconds or less.

In an aspect of the present invention, the curable composition has a viscosity (in centipoise) at a speed of $10 \text{ s}^{-1}$ of 10,000 to 500,000. The viscosity may be determined using known methods, for example, cone and plate rheometer, parallel plate rheometer, or rotation viscometer, such as Brookfield viscometer.

In aspects of the present invention, the curable composition is a photocurable or light curable composition, i.e., curable using light such as visible or ultraviolet light (UV). In aspects of the present invention, the curable composition may be cured using a light source, such a bulb or LED that produces visible or UV light. In an aspect of the invention, the curable composition is at least partially cured by exposing the side of the membrane without the topographical features to the light source, typically a visible light source.

Figure 4:
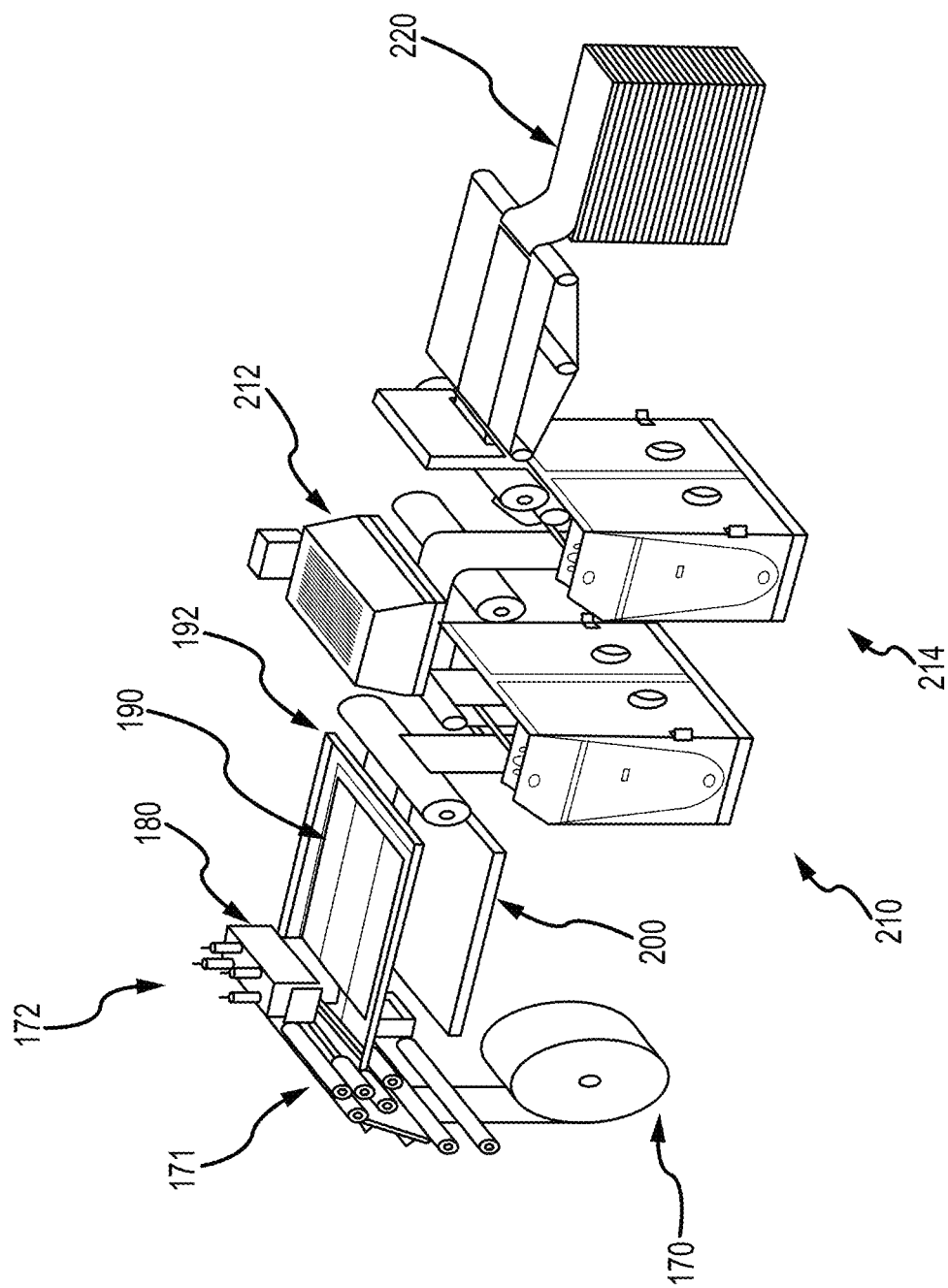
FIG. 4 shows a schematic of various work stations for making the membranes having a pattern of topographical features, including deposition, partial curing and full curing stations, as well as a storage or cutting station (not shown).

In another aspect of the invention, there is provided a system, which in addition to some or all of the aforementioned feature, further includes several processing stations as represented in FIG. 4. As shown in FIG. 4, a supply of membrane material 170 (without features provided thereon and also referred to herein as a substrate) is fed by a series of rollers 171 to an application station 172 where the topographical features are applied via dispensers 180. The membrane may be selected from reverse osmosis membranes, forward osmosis membranes, microfiltration membranes, ultrafiltration membranes, and nanofiltration membranes. The membrane travels under template 190 and is positioned by rollers 171, aligned with table 192, such that the curable composition can be dispensed onto the membrane using the template to control the positioning of the thus formed topographical features on the membrane. The table and roller system also allow for adjustment of the tension on the membrane for better control of the application of the curable composition, which forms the topographical features. The template (stencil) ensures that the adhesive reaches the intended areas of the membrane as dictated by the pattern of openings in the template. The topographical features are applied to the membrane via curable composition dispensers 180, which are indexed with/above the template (stencil) such that the desired amount of curable composition is applied to designated template openings, which expose underlying membrane portions, to create the intended topographical feature-pattern on the membrane. The pattern of the features is thus controlled by the template. The size and shape of the features can be varied as discussed in various sections of this disclosure and tailored to create intended products and product applications. The dispensing device 180, may include valves and a squeegee wiping device (not shown) for providing consistency of height and removing unwanted curable composition from the template (stencil) area. The pattern of features formed may be random or ordered as desired to fit a particular product and/or application, and may include a plurality of shapes as well, including without limitation, circles, ovals, arcs, squares, rectangles, diamonds, pentagons, hexagons, stars, chevrons, and combinations thereof.

Template 190, also referred to herein as a stencil, may be made from a variety of materials, including without limitation, steel, aluminum, stainless steel, polymeric coated metal, a ceramic coated metal, metal fabric, composite materials, a polymer, such as polyester or fluoropolymers, a polymer fabric, and combinations thereof.

Station 172 in FIG. 4 further includes a vacuum or pressure table 192, the table functioning as a first support for the membrane, which is a positioning device and which serves to hold the membrane fixed while applying the features to the membrane. The vacuum and/or pressure table provides a back pressure which seals the substrate against the stencil to prevent leakage of the adhesive beyond the desired pattern. This vacuum and/or pressure table provides a vacuum which holds down the substrate to allow removal-force to be applied for removal of the pre-cured features from the stencil.

Also included in station 172 is a light source 200 for partially curing or setting the curable composition, e.g. sufficiently fixing the topographical features formed by the curable composition so as to prevent substantial distortion or change in dimensions, thereby allowing further processing without of loss of the intended topography, size or shape. As described in this disclosure herein, a variety of light sources may be employed for partial curing, the selection of which being dependent on the type of cure system present in the curable composition. For example, if the curable composition includes a cure system which responds to UV light, then a UV light source is employed. If the cure system responds to multiple types of light sources, then partial curing may be achieved using one or more different sources of light alone or in combination.

The time of exposure for partial curing can be vary depending on a number of factors, including the intensity of the light, the distance of the light from the curable composition and the temperature conditions. Generally, the process of applying the curable composition is conducted at room temperature (RT), although slight variations of temperature generally do not have a substantial effect on application and partial curing of the topographical features formed from the adhesive composition.

The partial curing device 200 and the full curing device 212 may emit light energy of the same or different wavelengths as disclosed herein.

To permit partially curing of the curable composition, support table 192 is desirably able to pass sufficient light there-through so that the light can reach the curable composition and sufficiently fix the composition as described herein. Table 192 may be translucent or transparent to facilitate transmission of the light there-through.

The system of FIG. 4 further includes a full-cure station 210, where the curable composition as applied and fully cured on the membrane by one or more additional light sources 212. The membrane having fully cured topographical features (i.e., the topographically featured membrane) formed thereon may be further processed, for example by cutting the membrane into a desired length or width at a cutting station 214 and may be then collected as, for example, shown at 220. The thus formed topographically featured membrane may then be further stored for future use in a desired filtration device or the system as described may be integrated into a continuous process whereby specific filtration devices are formed. For example, a water filtration device may be formed by spirally winding the topographically featured membrane around a core tubular member, as is conventional in the art for such products.

In another aspect of the present invention, the curable composition may be cured to a solid state after the removal of the stencil or screen. In another aspect of the present invention, the curable composition may be cured to a solid state (e.g., fully cured) before the removal of the stencil or screen.

In yet another aspect of the present invention, the curable composition may be partially cured prior to removal of the stencil. As used herein, "partially cure" means to cure the curable composition to a state sufficient to hold the shape of its topographical features but insufficient to cause adhesion to the stencil or screen. In an aspect of the present invention, the curable composition may be exposed to conditions to partially cure the curable composition. In an aspect of the invention, this partial curing may be produced by exposing the side of the membrane without the topographical features to a visible light source. In other aspects of the present invention, this partial curing may be produced by exposing the side of the membrane without the topographical features to light at an energy dose of about 50 mJ/cm$^2$ to about 350 mJ/cm$^2$, about 510 mJ/cm$^2$ to about 300 mJ/cm$^2$, or about 125 mJ/cm$^2$ to about 250 mJ/cm$^2$. In another aspect of the present invention, the light used to produce this partial curing has a wavelength of about 405 nm.

In another aspect of the present invention, the partially cured curable composition is further exposed to conditions to cure the curable composition to a solid state. In an additional aspect of the present invention, after the removal of the stencil or screen, the partially cured curable composition may be cured to a solid state, desirably a fully cured state, by exposing it to a UV or visible light source as described above and further discussed with respect to FIG. 4. In other aspects of the present invention, this full curing may be produced by exposing the curable composition to light at an energy dose of about 5 J/cm$^2$ to about 11 J/cm$^2$, about 6 J/cm$^2$ to about 10 J/cm$^2$, or about 7 J/cm$^2$ to about 9 J/cm$^2$. In another aspect of the present invention, the light used to produce this full curing has a wavelength of about 405 nm.

In this aspect of the present invention, the viscosity of the curable composition may be increased prior to removal of the stencil or screen to aid in maintaining the shape of the topographical features during removal of the stencil. In some instances, this partial curing gels the curable composition or partially cures the curable composition to a semi-solid state. As discussed above, the stencil or screen may be made from a coated metal that provides a low surface energy to allow the release of the curable composition from the stencil via the limited adhesion created to the membrane during the pre-cure.

This partial cure method allows for dramatically improved aspect ratios over wet printing as it can achieve any height desired in one step (i.e., 0.005-0.040 inches), instead of requiring deposition of multiple layers to reach the necessary height).

In a further aspect of the present invention, there is provided a light curable composition including: a light curable component comprising a backbone having residues from (meth)acrylates, epoxies, polyisobutylenes (PIB), polyurethanes (PU), polyolefins (PO), ethylvinylacetates (EVA), polyamides (PA) and combinations thereof; and a light curing moiety; a cure system; and rheology modifying component present in an amount of about 2% to about 50% by weight of the total curable composition; wherein the curable composition has a viscosity of 10,000 to 500,000 centipoise (cP) at 10 s$^{-1}$, the curable composition is Thixotropic Index (TI) (viscosity at 1 s$^{-1}$/viscosity at 10 s$^{-1}$) of between about 2 and about 15.

For instance, materials used to make such polymer backbones include (meth)acrylic monomers such as (meth) acrylic acid, methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth) acrylate, n-pentyl (meth)acrylate, n-hexyl (meth)acrylate, cyclohexyl (meth)acrylate, n-heptyl (meth)acrylate, n-octyl (meth)acrylate, 2-ethylhexyl (meth)acrylate, nonyl (meth) acrylate, decyl (meth)acrylate, dodecyl (meth)acrylate, phenyl (meth)acrylate, tolyl (meth)acrylate, benzyl (meth)acrylate, 2-methoxyethyl (meth)acrylate, 3-methoxybutyl (meth) acrylate, 2-hydroxyethyl (meth)acrylate, 2-hydroxypropyl (meth)acrylate, stearyl (meth)acrylate, glycidyl (meth)acrylate, 2-aminoethyl (meth)acrylate, γ-(methacryloyloxypropyl) trimethoxysilane, (meth)acrylic acid-ethylene oxide adduct, trifluoromethylmethyl (meth)acrylate, 2-trifluoromethylethyl (meth)acrylate, 2-perfluoroethylethyl (meth)acrylate, 2-perfluoroethyl-2-perfluorobutylethyl (meth)acrylate, 2-perfluoroethyl (meth)acrylate, perfluoromethyl (meth) acrylate, diperfluoromethylmethyl (meth)acrylate, 2-perfluoromethyl-2-perfluoroethylmethyl (meth)acrylate, 2-perfluorohexylethyl (meth)acrylate, 2-perfluorodecylethyl (meth)acrylate, 2-perfluorohexadecylethyl (meth)acrylate, etc.; styrenic monomers such as styrene, vinyltoluene, α-methylstyrene, chlorostyrene, styrenesulfonic acid and its salt; fluorine-containing vinyl monomers such as perfluoroethylene, perfluoropropylene, vinylidene fluoride, etc.; silicon-containing vinyl monomers such as vinyltrimethoxysilane, vinyltriethoxysilane, etc.; maleic anhydride, maleic acid, monoalkyl esters and dialkyl esters of maleic acid; fumaric acid and monoalkyl esters and dialkyl esters of fumaric acid; maleimide monomers such as maleimide, methylmaleimide, ethylmaleimide, propylmaleimide, butylmaleimide, hexylmaleimide, octylmaleimide, dodecylmaleimide, stearylmaleimide, phenylmaleimide, cyclohexylmaleimide, etc.; nitrile-containing vinyl monomers such as acrylonitrile, methacrylonitrile, etc.; amide-containing vinyl monomers such as acrylamide, methacrylamide, etc.; vinyl esters such as vinyl acetate, vinyl propionate, vinyl pivalate, vinyl benzoate, vinyl cinnamate, etc.; alkenes such as ethylene, propylene, etc.; conjugated diener such as butadiene, isoprene, etc.; vinyl chloride, vinylidene chloride, allyl chloride and allyl alcohol. These monomers may be used each alone or a plurality of them may be copolymerized.

Suitable examples of epoxies useful for making such backbones include, but are not limited to, bisphenol A epoxies, bisphenol F epoxies, novolac epoxies, aliphatic epoxies, glycidylamine epoxies, and cycloaliphatic epoxies.

Suitable examples of polyisobutylenes (PIB) useful for making such backbones include, but are not limited to, polyisobutylene diacrylate as described in U.S. Patent Application Publication No. 2014/0243444A1.

Suitable examples of polyurethanes (PU) useful for making such backbones include, but are not limited to, polyester urethane acrylate and polyether urethane acrylate.

Suitable examples of polyolefins (PO) useful for making such backbones include, but are not limited to, UC-102M and UC-203M from Kuraray, polyethylacrylate and polybutylacrylate as described in U.S. Pat. Nos. 7,781,494 and 6,720,395.

The light curing moiety is attached to the polymer backbone, desirably but not necessarily, at the terminal ends of the polymer backbone, and may be any chemical moiety or group which when exposed to actinic radiation, such a LED, visible or UV light, cures via a crosslinking reaction. For example, vinyl groups, (meth)acrylate, and epoxy groups.

In an aspect of the present invention, the light curable component includes a material selected from the group consisting of a urethane (meth)acrylate and a (meth)acylate.

The cure system includes at least one cure initiator, and optionally, a sensitizing compound capable of absorbing radiation in the appropriate range of about 300-1000 nm and/or an electron donor. The cure initiator (or, photoinitiator), may be a UV initiator, a visible initiator or a combination of UV and visible initiators.

A variety of UV initiators may be employed. UV initiators are generally effective in the 200 to 400 nm range, and particularly in the portion of the spectrum that borders on the invisible light and the visible portion just beyond this, e.g. >200 nm to about 390 nm.

Initiators that will respond to UV radiation to initiate and induce curing of the (meth)acryl functionalized curable component, which are useful in the present invention include, but are not limited to, benzophenone and substituted benzophenones, acetophenone and substituted acetophenones, benzoin and its alkyl esters, xanthone and substituted xanthones, phosphine oxides, diethoxy-acetophenone, benzoin methyl ether, benzoin ethyl ether, benzoin isopropyl ether, diethoxyxanthone, chloro-thio-xanthone, N-methyl diethanol-amine-benzophenone, 2-hydroxy-2-methyl-1-phenyl-propan-1-one, 2-benzyl-2-(dimethylamino)-1-[4-(4-morpholinyl)phenyl]-1-butanone and mixtures thereof.

Examples of such UV initiators include initiators available commercially from IGM Resins under the "IRGACURE" and "DAROCUR" tradenames, specifically "IRGACURE" 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-dimethoxy-2-phenyl acetophenone), 1700 (the combination of bis(2,6-dimethoxybenzoyl-2,4,4-trimethyl pentyl) phosphine oxide and 2-hydroxy-2-methyl-1-phenyl-propan-1-one), and 819 [bis(2,4,6-trimethyl benzoyl)phenyl phosphine oxide], and "DAROCUR" 1173 (2-hydroxy-2-methyl-1-phenyl-1-propane) and 4265 (the combination of 2,4,6-trimethylbenzoyldiphenyl-phosphine oxide and 2-hydroxy-2-methyl-1-phenyl-propan-1-one); and 2,4,6-trimethylbenzoyldiphenylphosphine oxide (commercially available as LUCIRIN TPO from BASF Corp.). Of course, combinations of these materials may also be employed herein. Of course, it is understood that some of these photoinitiators categorized herein as UV photoinitiators have a tailing absorption into the visible range, and thus straddle the line between UV and visible light cure initiators, but nonetheless are included herein as part of the invention.

Initiators suitable for use in the present invention that will respond to visible light to initiate and induce curing include, but are not limited to, camphorquinone peroxyester initiators, 9-fluorene carboxylic acid peroxyesters, visible light [blue] photoinitiators, dl-camphorquinone, "IRGACURE" 784DC (photoinitiator based on substituted titanocenes), and combinations thereof.

Other suitable photoinitiator systems include those disclosed in each of the following patents or publications, each of which is incorporated by reference herein in its entirety. U.S. Pat. No. 4,505,793 to Tamoto et al., which is incorporated by reference herein, discloses photopolymerization initiators that include a combination of a 3-keto-substituted cumarin compound and an active halogen compound. A number of exemplary compounds are disclosed. Such photopolymerization initiators cure by exposure to light having wavelengths ranging between about 180 nm and 600 nm. U.S. Pat. No. 4,258,123 to Nagashima et al., which is incorporated by reference herein, discloses photosensitive resin compositions including initiator components that generate a free radical upon irradiation with actinic light. Such components include various triazine compounds, as more fully described therein.

Cationic photoinitiators for epoxy cure include diaryliodonium salts, triarylsulfonium salts, and phenacylsulfonium salts. Commercially available cationic photoinitiator include Omnicat 432 (triarylsulfonium hexafluorophosphate salts), Omnicat 440 (4,4'-dimethyl-diphenyl iodonium hexafluorophosphate), and Omnicat 550 (10-biphenyl-4-yl-2-isopropyl-9-oxo-9H-thioxanthen-10-ium hexafluorphosphate).

Additional useful components are disclosed in the following document, which is incorporated herein by reference. European Patent Publication No. EP 0 369 645 A1 discloses a three-part photoinitiator system which includes a trihalomethyl substituted-s-triazine, a sensitizing compound capable of absorbing radiation in the range of about 300-1000 nm and an electron donor. Exemplary sensitizing compounds are disclosed, including: ketones; coumarin dyes; xanthene dyes; 3H-xanthen-3-one dyes; acridine dyes; thiazole dyes; triazine dyes; oxazine dyes; azine dyes; aminoketone dyes; methane and polymethine dyes; porphyrins; aromatic polycyclic hydrocarbons; p-substituted aminostyryl ketone compounds; aminotriaryl methanes; merocyanines; squarylium dyes; and pyridinium dyes. Exemplary donors also are disclosed, including: amines; amides; ethers; ureas; ferrocene; sulfinic acids and their salts; salts of ferrocyanide; ascorbic acid and its salts; dithiocarbamic acid and its salts; salts of xanthates; salts of ethylene diamine tetraacetic acid; and salts of tetraphenylboronic acid. Such initiators are sensitive to both UV and visible light.

Additional useful components are disclosed in European Patent Publication No. EP 0 563 925 A1. There, photopolymerization initiators are provided that include a sensitizing compound that is capable of absorbing radiation in the range of about 250-1000 nm and 2-aryl-4,6-bis(trichloromethyl)-1,3,5-triazine. Exemplary sensitizing compounds that are disclosed include: cyanine dye, merocyanine dye, coumarin dye, ketocoumarin dye, (thio)xanthene dye, acridine dye, thiazole dye, thiazine dye, oxazine dye, azine dye, aminoketone dye, squarylium dye, pyridinium dye, (thia)pyrylium dye, porphyrin dye, triaryl methane dye, (poly)methane dye, amino styryl compounds and aromatic polycyclic hydrocarbons. These photopolymerization initiators are sensitive to UV and visible light.

U.S. Pat. No. 5,395,862 to Neckers et al., which is incorporated by reference herein, discloses fluorone photoinitiators, which are sensitive to visible light. Such fluorone initiator systems also include a coinitiator, which is capable of accepting an electron from the excited fluorone species. Exemplary coinitiators are disclosed, including: onium salts, nitrohalomethanes and diazosulfones. U.S. Pat. No. 5,451,343 to Neckers et al., which is incorporated herein by reference, discloses fluorone and pyronin-Y derivatives as initiators that absorb light at wavelengths of greater than 350 nm. U.S. Pat. No. 5,545,676 to Palazzotto et al., which is incorporated by reference herein, discloses a three-part photoinitiator system, which cures under UV or visible light. The three-part system includes an arylidonium salt, a sensitizing compound and an electron donor. Exemplary iodonium salts include diphenyliodonium salts. Exemplary sensitizers and electron donors for use in the three-part system also are disclosed. Additionally, the sensitizer is capable of absorbing light in the range of about 300-1000 nm.

The initiators set forth above are for the purposes of illustration only and are in no way meant to limit the initiators that may be used in the present invention.

Initiators may be employed in amounts of about 0.1% to about 10% by weight of the total composition. More desirably, the initiator is present in amounts of 0.5% to about 5% by weight of the total composition.

As used herein, "rheology modifying component" means a composition or compound that changes the rheological properties, e.g., viscosity or flow, of the curable composition. Suitable rheology modifying components include organic and inorganic ones. Inorganics include silica, silicate, alumina, asbestos, barium sulphate, calcium carbonate, calcium fluoride, carbon black, clays, diatomaceous earth, feldspar, ferromagnetics, fly ash, glass fibers, gypsum, jute fiber, kaolin, lingnocellulosics, magnesium hydroxide, mica, microcrystalline cellulose, powdered metals, quartz, starch, talc, titanium dioxide, wood flour, wood fibers, and combinations thereof. Organic rheology modifiers include thermoplastic polymers such as polyvinylacetate, polyolefine, nylon fibers. In an aspect of the present invention, the rheology modifying component is present in amounts of about 2% to about 80% by weight based on the total weight of the curable composition. In another aspect of the present invention, the rheology modifying component is present in amounts of about 4% to about 50% by weight based on the total weight of the curable composition. In other aspects of the present invention, the rheology modifying component is present in amounts of about 5%, or about 10%, or about 15%, or about 20% or about 25%, or about 30%, or about 35%, or about 45%, or about 55%, or about 60%, or about 65%, or about 75% weight based on the total weight of the curable composition.

Optional additives, such as, but not limited to, stabilizers, inhibitors, oxygen scavenging agents, fillers, dyes, colors, pigments, adhesion promoters, plasticizers, toughening agents, reinforcing agents, fluorescing agents, wetting agents, antioxidants and combinations thereof also may be included in the compositions of the present invention.

In an aspect of the invention, the curable composition subsequent to cure loses less than about 5% weight when submerged in an aqueous solution at a pH range of about 0.5 to about 13.5 at temperatures of from about 25° C. to about 90° C. for a period of time of within 6 weeks.

In another aspect of the invention, the curable composition is capable of forming and maintaining topographical surface features having an aspect ratio (height/width) of greater than about 0.5 prior to cure.

The topographic features formed on the membrane surface by the methods of the present invention have physical characteristics that make them suitable for providing spacing between overlaid layers of the membrane. For example, the topographic features may provide adequate spacing between layers of a spiral reverse osmosis filtering membrane to optimize the operation, cleaning, and lifespan of reverse osmosis membrane elements employing membranes with these topographical features. Moreover, the topographical features are typically smooth or flat, with no sharp edges that may damage the mating layer of membrane during operation.

In an aspect of the present invention, the aspect ratio of the topographical features is greater than 0.50 or greater than about 0.70. A combination of aspect ratios may be used in a pattern to provide a specified spacing configuration between layers of membrane or other surfaces in the osmosis devices of the invention. As used herein, the term "aspect ratio" means the ratio of the height of the topographical features to the width of the topographical features.

In an aspect of the present invention, the height of the topographical features is from about 0.001 to about 0.05 inches. In another aspect of the present invention, the height of the topographical features is from about 0.01 to about 0.04 inches. The height of a topographical feature is the distance from the base of the topographical feature (on the membrane surface) to the point on the topographical feature that is farthest perpendicularly from the membrane surface.

In an aspect of the present invention, the width of the topographical feature is defined as the minimal dimension of a topographical feature footprint on a membrane surface, wherein the footprint is area or region of coverage on the substrate surface.

In an aspect of the present invention, the pattern of topographical features is formed on the membrane surface at speeds of about 0.5 m$^2$/minute or greater. In other aspects of the present invention, the pattern of topographical features is formed on the membrane surface at speeds of about 1 m$^2$/minute or greater or at speeds of about 2 m$^2$/minute or greater.

The printing speed of the topographical features of the present invention may also be optimized because the desired height may be achieved while only depositing a single layer of curable composition without adversely affecting the aspect ratio and the overall membrane efficiency (as opposed to having to coat and cure 10-20 layers of UV ink, for example). Moreover, this single layer of deposition is also carried out over the entire 40 inch width of the membrane simultaneously. Thus, the time for printing a single leaf is the linear rate of travel down the length of the leaf (also 40 inches). Accordingly, there is no need for travel in both the X and Y direction with multiple passes. Essentially, there is no need to deposit multiple layers of curable composition to achieve the desired height prior to curing or pre-curing on the membrane. This offers significant speed advantage over other technologies. By way of example, UV inks deposit maximum of 0.001 inch of height per pass. The processes of the present invention can in the wet printing method deposit 10 times that, i.e., up to 0.010 inch per pass and the pre-cure method can deposit 40 times that, i.e., up to of 0.040 inch per pass. The methods of the present invention are also capable of depositing less than the maximum heights in a single pass for full flexibility in topographical feature design.

In other aspects of the present invention, the application of positive or negative pressure during one or more of the overall methods of forming topographical features on a membrane surface. In aspects of the present invention, the overall method of forming topographical features on a membrane surface includes the steps of:

A) the membrane is fed onto a support, e.g. a support table 192, with its second surface facing downward and in contact with the support;
B) the membrane is aligned under the stencil;
C) the membrane is made flat on the support;
D) the stencil is lowered onto the first (upward facing) surface of the membrane;
E) the curable composition is deposited from composition dispensers 180 into the stencil openings and onto the first surface to form topographical features;
F) the curable composition is partially cured using light source 180;
G) the stencil is removed from the first surface of the membrane;
H) the curable composition is cured to a solid state, desirably a fully cured state at station 210 using light source (energy source) 220;
I) the membrane is removed from the support.

In aspects of the invention, step H) may be carried out at the same time a step I). For example, curing can be occurring with a static light source while the membrane is moved past the light source during removal.

In an aspect of the present invention, positive pressure is applied to the second surface of the membrane to force the first surface into contact stencil during steps E) and F). As discussed above, this positive pressure thereby creates a stronger contact between the first surface and the stencil during the deposition of the curable composition into the stencil openings thereby reducing the bleeding of the curable composition. However, the positive pressure must not be so high that it leads to damage to the membrane. In aspects of the invention, positive pressure during steps E) and F) has a magnitude between about 5 psi and about 50 psi, between about 10 psi and about 40 psi, or between about 20 psi and 30 psi.

In an aspect of the present invention, positive pressure may be applied to the second surface of the membrane during at least a portion of one or both of steps A) and B). In another aspect of the present invention, positive pressure is applied to the second surface of the membrane during at least a portion of one or both of steps H) and I). Thus, the membrane may be floated during its removal form the support by an air-flow device (not shown). The positive pressure floats the membrane above the support allowing for gentle feeding and aligning of the membrane on the support. As used herein, the term "float" means to lift the membrane to reduce or eliminate the contact between the membrane and the support. In an additional aspect of the present invention, the magnitude of the positive pressure needed to float the membrane is about 10 psi or less, preferably 5 psi.

In an aspect of the present invention, negative pressure may be applied by suction or vacuum device (not shown) to the second surface of the membrane during at least a portion of one or both of steps C) and D). Thus, the membrane may be held against the support to maintain is flatness and position during the lowering of the stencil while avoiding the damage often associated with physically restraining movement of the membrane. In another aspect of the present invention, negative pressure is applied to the second surface of the membrane during at least a portion of step G). Thus, the membrane may be held against the support while the stencil is lifted and removed from the first surface of the membrane. The negative pressure allows for the removal of the stencil without the need for pulling on the membrane which often leads to damage. In an additional aspect of the present invention, the magnitude of the negative pressure needed to maintain the position of the membrane on the support is about 100 torr or less, preferably 50 torr.

Another method of forming topographical features on a membrane surface according to the present invention includes the steps of: providing an apparatus with a support for supporting a membrane having a first surface and a second opposing surface and capable of producing a positive pressure and a negative pressure on the surface of the membrane in contact with the support; placing the second surface of the membrane in contact with the support; providing a stencil over the first surface of the membrane, the stencil having openings exposing the first surface for receiving a curable composition; applying positive pressure to the second surface to contact the first surface to the stencil; depositing one or more layers of curable composition into the stencil openings and onto the first surface to form topographical features, the openings defining an approximate shape and size of the topographical features; exposing the curable composition to conditions to partially cure the curable composition to a state sufficient to hold its topographical features but insufficient to cause adhesion to the stencil; and applying negative pressure to the second surface to separate the membrane and stencil without disturbing the partially cured topographical features; wherein the positive pressure is sufficient to reduce a halo area around the topographical features by at least 10%.

In general, the foregoing description is provided for exemplary and illustrative purposes; the present invention is not necessarily limited thereto. Rather, those skilled in the art will appreciate that additional modifications, as well as adaptations for particular circumstances, will fall within the scope of the invention as herein shown and described and of the claims appended hereto.

EXAMPLE

Figure 3A:
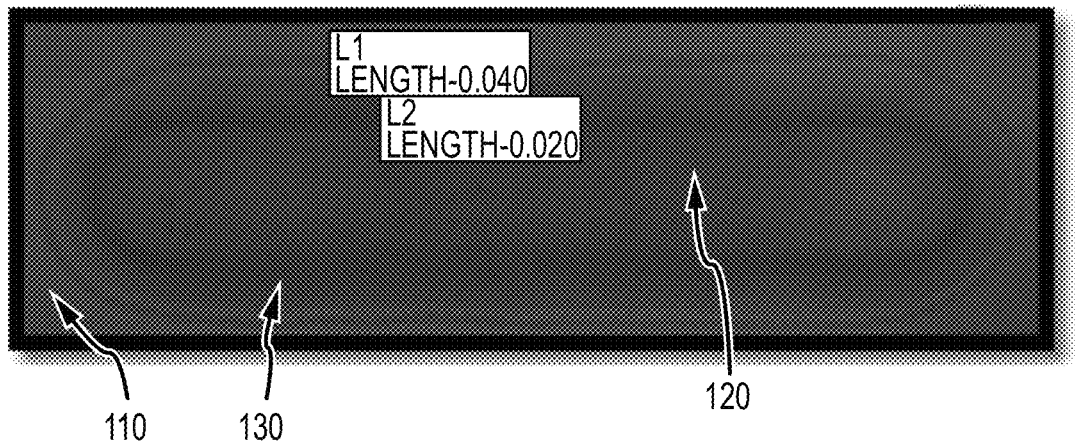
In FIG. 3a, the topographical feature was printed without using positive pressure during the application of the curable composition.

A comparative topographical feature was produced using the process above with no positive pressure applied during the deposition of the curable composition and partial curing. As shown in FIG. 3a, this non-inventive method produced a pronounced halo (130) on the membrane surface (110) around the topographical feature (120). This halo was measure as having a halo area ($A_h$) of about 0.42 as compared to the area of the topographical area ($A_{tf}$).

Figure 3B:
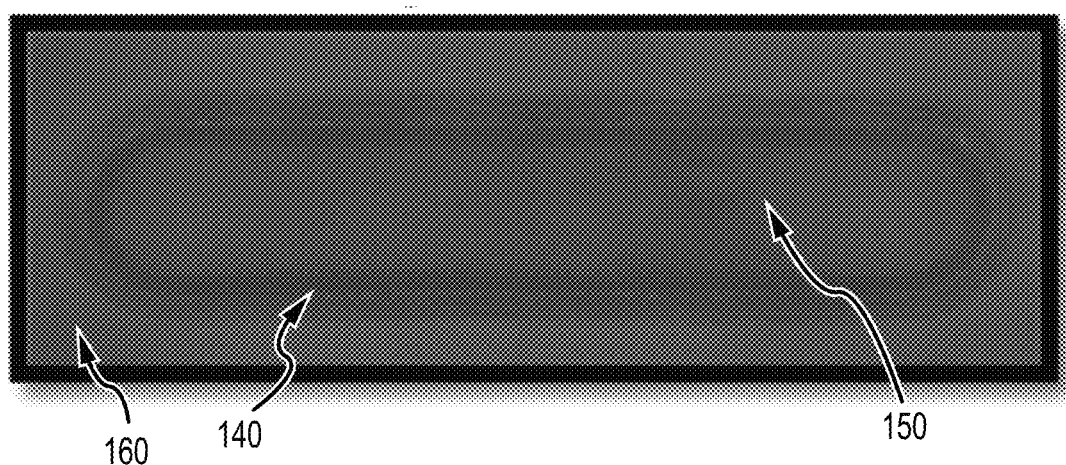
In FIG. 3b, the topographical feature was printed using positive pressure during the application of the curable composition.

A topographical feature was produced using the inventive process using the method above and applying 30 psi of positive pressure applied during the deposition of the curable composition and partial curing. As shown in FIG. 3b, this inventive method produced an almost undetectable halo (160) on the membrane surface (140) around the topographical feature (150). This halo was measure as having a halo area ($A_h$) of about 0.25 as compared to the area of the topographical area ($A_{tf}$).

In view of the forgoing, the inventive method produced a percentage reduction of the halo area of about 40.5%.

The invention claimed is:

1. A method of forming topographical features on a membrane surface comprising:
   a. providing a stencil over a first surface of a membrane, the stencil having openings exposing the first surface for receiving a curable composition;
   b. applying positive pressure to a second opposing surface of the membrane to contact the first surface to the stencil;
   c. depositing one or more layers of curable composition into the stencil openings and onto the first surface to form topographical features, the openings defining an approximate shape and size of the topographical features;
   d. exposing the curable composition to conditions to partially cure the curable composition to a state sufficient to hold its topographical features but insufficient to cause adhesion to the stencil; and
   e. applying negative pressure to the second surface to separate the membrane and stencil without disturbing the partially cured topographical features;
wherein the positive pressure is sufficient to reduce a halo area around the topographical features by at least about 25%.

2. The method of claim 1, wherein the conditions to partially cure the curable composition the curable composition comprise exposing the membrane to a light source.

3. The method of claim 2, wherein the light from the light source is applied to the second surface.

4. The method of claim 1, further comprising f. exposing the partially cured topographical features to conditions to cure the curable composition to a solid state.

5. The method of claim 4, wherein the conditions to cure the curable composition to a solid state comprise exposing the membrane to a light source.

6. The method of claim 1, wherein the depositing step comprises depositing two or more layers of curable composition into the stencil openings and onto the first surface.

7. The method of claim 1, wherein the positive pressure is sufficient to reduce the halo area around the topographical features by at least about 40%.

8. A method of forming topographical features on a membrane surface comprising:
   a. providing an apparatus with a support for supporting a membrane having a first surface and a second opposing surface and capable of producing a positive pressure and a negative pressure on the surface of the membrane in contact with the support;
   b. placing the second surface of the membrane in contact with the support;
   c. providing a stencil over the first surface of the membrane, the stencil having openings exposing the first surface for receiving a curable composition;
   d. applying positive pressure to the second surface to contact the first surface to the stencil;
   e. depositing one or more layers of curable composition into the stencil openings and onto the first surface to form topographical features, the openings defining an approximate shape and size of the topographical features;
   f. exposing the curable composition to conditions to partially cure the curable composition to a state sufficient to hold its topographical features but insufficient to cause adhesion to the stencil; and
   g. applying negative pressure to the second surface to separate the membrane and stencil without disturbing the partially cured topographical features;
wherein the positive pressure is sufficient to reduce a halo area around the topographical features by at least about 25%.

9. The method of claim 8, wherein the conditions to partially cure the curable composition comprise exposing the membrane to a light source.

10. The method of claim 9, wherein the light from the light source is applied to the second surface.

11. The method of claim 8, further comprising h. exposing the partially cured topographical features to conditions to cure the curable composition to a solid state.

12. The method of claim 11, wherein the conditions to cure the curable composition to a solid state comprise exposing the membrane to a light source.

13. The method of claim 8, further comprising removing the membrane from the support.

14. The method of claim 13, wherein positive pressure is applied to second surface during removing the membrane from the support.

15. The method of claim 13, wherein step h. is carried out before, during, or after removing the membrane from the support.

16. The method of claim 8, wherein positive pressure is applied to the second surface during the placing the second surface of the membrane in contact with the support step.

17. The method of claim 8, wherein negative pressure is applied to the second surface after the placing the membrane on the support step and during the providing a stencil over the first surface step.

18. The method of claim 8, wherein the depositing step comprises depositing two or more layers of curable composition into the stencil openings and onto the first surface.

19. The method of claim 8, wherein the positive pressure is sufficient to reduce the halo area around the topographical features by at least about 25%.

* * * * *